US010763837B2

(12) United States Patent
Casagrande

(10) Patent No.: US 10,763,837 B2
(45) Date of Patent: Sep. 1, 2020

(54) REFERENCE OSCILLATOR WITH VARIABLE DUTY CYCLE, FREQUENCY SYNTHESIZER AND SIGNAL RECEIVER WITH REFERENCE OSCILLATOR

(71) Applicant: The Swatch Group Research and Development Ltd, Marin (CH)

(72) Inventor: Arnaud Casagrande, Bole (CH)

(73) Assignee: The Swatch Group Research and Development Ltd, Marin (CH)

( * ) Notice: Subject to any disclaimer, the term of this patent is extended or adjusted under 35 U.S.C. 154(b) by 0 days.

(21) Appl. No.: 16/390,095

(22) Filed: Apr. 22, 2019

(65) Prior Publication Data
US 2019/0363703 A1    Nov. 28, 2019

(30) Foreign Application Priority Data
May 24, 2018    (EP) .................................... 18174100

(51) Int. Cl.
*H03K 5/04*     (2006.01)
*H03K 5/156*    (2006.01)
*H03K 5/08*     (2006.01)

(52) U.S. Cl.
CPC ............. *H03K 5/1565* (2013.01); *H03K 5/04* (2013.01); *H03K 5/086* (2013.01)

(58) Field of Classification Search
CPC ........ H03K 5/1565; H03K 5/086; H03K 5/04; H03L 7/08; H03L 7/1976; H03L 7/23
USPC ......................................................... 327/175
See application file for complete search history.

(56) References Cited

U.S. PATENT DOCUMENTS

| 4,885,475 A    | 12/1989 | Farina |
| 6,060,922 A    | 5/2000  | Chow et al. |
| 6,356,129 B1   | 3/2002  | O'Brien et al. |
| 9,419,660 B2 * | 8/2016  | Casagrande ........... H04B 15/06 |
| 2007/0075787 A1| 4/2007  | Jensen |
| 2008/0129352 A1| 6/2008  | Zhang |

(Continued)

FOREIGN PATENT DOCUMENTS

| EP | 0 358 518 A1    | 3/1990 |
| WO | WO 01/28100 A1  | 4/2001 |
| WO | WO 2008/067324 A1 | 6/2008 |

OTHER PUBLICATIONS

European Search Report dated Nov. 14, 2018 in European Application 18174100.0 filed on May 24, 2018 (with English translation of categories of Cited Documents).

*Primary Examiner* — Ryan Jager
(74) *Attorney, Agent, or Firm* — Oblon, McClelland, Maier & Neustadt, L.L.P.

(57) ABSTRACT

A reference oscillator for a transmitter and/or a receiver of electromagnetic signals. The reference oscillator is suitable for generating a modified reference signal alternating ON times and OFF times with a predefined duty cycle from a signal supplied by a reference resonator. The reference oscillator also includes an adjustment circuit suitable for adjusting the duty cycle of the modified reference signal according to at least one adjustment parameter dependent on a rank of at least one harmonic component of the modified reference signal so as to minimize at least one harmonic component of the modified reference signal. A frequency synthesizer and a radio frequency signal receiver can include such a reference oscillator.

8 Claims, 2 Drawing Sheets

(56) References Cited

U.S. PATENT DOCUMENTS

| | | | |
|---|---|---|---|
| 2010/0052578 A1* | 3/2010 | Kim | B06B 1/045 318/114 |
| 2012/0046005 A1* | 2/2012 | Simmons | H03K 3/0307 455/120 |
| 2012/0154010 A1* | 6/2012 | Singhal | H03K 3/017 327/299 |
| 2014/0194076 A1* | 7/2014 | Hwang | H04B 15/00 455/77 |
| 2020/0018794 A1* | 1/2020 | Uehara | H03B 5/32 |

* cited by examiner

REFERENCE OSCILLATOR WITH VARIABLE DUTY CYCLE, FREQUENCY SYNTHESIZER AND SIGNAL RECEIVER WITH REFERENCE OSCILLATOR

CROSS-REFERENCE TO RELATED APPLICATION

This application claims priority to European Patent Application No. 18174100.0 filed on May 24, 2018, the entire disclosure of which is hereby incorporated herein by reference.

TECHNICAL FIELD OF THE INVENTION

The invention relates to the field of reference oscillators and, more precisely in this field, reference oscillators comprising a means for suppressing or limiting at least one higher harmonic. The invention finds applications, for example, in the fields of receiving radio frequency signals, analogue-digital conversion, and frequency synthesis.

PRIOR ART

For transmitting electromagnetic signals, in particular radio frequency signals, appropriate receivers are needed. A conventional receiver is illustrated in FIG. 1. The signal receiver 1 comprises an antenna 12 for receiving electromagnetic signals. The antenna 12 is connected to a low noise amplifier 14 (LNA) suitable for amplifying the signals received by the antenna 12. The LNA is further connected to a mixer 16 for mixing the amplified and received signals with an oscillating signal 80 supplied by a frequency matching circuit 36, which is generally based on a reference oscillator 20. The output of the mixer 16 is connected to a band-pass (or low-pass) filter 18 for filtering the intermediate signals 40 of the mixer 16. In FIG. 1, the spectrum of the intermediate signals 40 is represented by the amplitude or the power (p) over the frequency (f).

Typically, the reference oscillator 20 uses a signal generator 24 with a reference resonator 22 such as a quartz resonator, supplying a well-defined and stable reference signal. For example, in typical applications of quartz resonators, the signal generator 24 with the reference resonator 22 operate at a reference frequency of 26 MHz. Generally, the reference oscillator 20 supplies a reference signal which is used as the basis for the frequency matching circuit 36.

In the case of a radio frequency transmission, the signal receiver 1 may, for example, operate in a Bluetooth range, therefore in the 2.4 GHz band by using a signal generator 24 with a quartz reference resonator 22 operating at 26 MHz. Through radiation and parasitic coupling, the 93rd, 94th and 95th higher harmonics of the frequency of the oscillator 20 based on the reference resonator 22 may then coincide with the frequency of the useful RF signals captured by the antenna 12, and end up converted in the band 41 of the band-pass (or low-pass) filter 18.

In general, the particular waveform of the reference signal introduces by parasitic coupling of the higher harmonics of the signal 50 on the input 12 (dashed arrow in FIG. 1) in the intermediate signals of the unwanted and polluting aliasing of the reference signal (present in the frequency band 41 of the filter 18). These harmonics have the effect, locally on their specific frequency, of a reduction in the sensitivity of the receiver. The exact frequency of these harmonics, and their amplitude depends directly on the duty cycle of the oscillating signal which, if it is not controlled, depends statistically on the conditions of production (manufacturing method) and use (temperature, voltage) of the integrated circuit comprising the oscillator, as well as typical variations of the reference resonator and its connections (PCB or card on which the integrated circuit comprising the resonator is formed, packaging, etc.).

The intermediate signals received by the filter may therefore be severely disrupted by the high frequency harmonic components of the signal from the reference resonator (injected by parasitic coupling on the desired RF signal). This problem becomes even more significant when the signal receiver is implemented in a single integrated circuit. This problem is even more significant in digital circuits, because of the very steep transitions of the reference (or clock) signal and the synchronous consumption peaks of the logic circuits.

Patent application EP 2 869 483 A1 describes this problem in detail, and provides for removing at least one of these harmonics by adjusting the duty cycle of the oscillator signal. The adjustment is performed step-by-step, by incremental changes in the duty cycle adjusted according to a measurement of the effect of a previous variation, until a minimum disruption is obtained.

This solution is interesting insofar as it greatly minimizes and even suppresses the harmonics polluting the output signal 40 of the receiver. However, this solution requires a setting up time at each activation. This activation time may be long, or even too long for some applications.

SUMMARY OF THE INVENTION

The object of the invention is to supply an alternative solution to the solution provided in patent application EP 2 869 483 A1, which does not require any setting up time at the startup.

To this end, the invention provides a new reference oscillator for a radio frequency signal transmitter and/or receiver. The reference oscillator is suitable for generating a modified reference signal alternating ON times and OFF times with a predefined duty cycle from a signal supplied by a reference resonator. The invention is characterized in that the reference oscillator comprises an adjustment circuit suitable for adjusting the duty cycle of the reference signal modified according to at least one predefined adjustment parameter so as to minimize at least one harmonic component of the modified reference signal.

Thus, by appropriately and deterministically adjusting the duty cycle of the modified reference signal produced by the reference oscillator according to the invention, it is possible to minimize the pollution generated by certain harmonics of the modified reference signal, e.g. around a particular frequency. In addition, as the duty cycle is adjusted by predetermined parameters, notably according to the rank of the harmonic or harmonics to be minimized, and not by successive adjustments, the duty cycle is adjusted as soon as the oscillator is activated.

According to one embodiment, the oscillator may also comprise a reference generator coupled to the resonator for producing an initial reference signal, the adjustment circuit being coupled to the reference generator for generating the modified reference signal with a predefined duty cycle from the initial reference signal.

The adjustment circuit of the oscillator may comprise a circuit for synchronizing the modified reference signal on one flank of the initial reference signal. This makes it possible to overcome a possible phase drift which could appear in the adjustment circuit.

According to one implementation, the receiver comprises a Man/Machine interface for enabling a user to supply the adjustment circuit with at least one adjustment parameter of the duty cycle. The adjustment of the duty cycle is thus immediate, as soon as the reference oscillator is activated, and the duty cycle may be adjusted in real time in case of a change in the frequency around which the harmonics have to be minimized.

The invention also provides a frequency synthesizer comprising a reference oscillator, as described above and a frequency matching circuit for producing a high frequency oscillating signal from the modified reference signal. By adjusting the duty cycle of the reference oscillator adjustment circuit, the high frequency oscillating signal offers the advantage of being rid of its harmonics around a particular frequency, as soon as the reference oscillator is activated.

According to one embodiment, the frequency matching circuit comprises a PLL loop arranged for receiving the modified reference signal of frequency $f_{ref}$ and producing an oscillating signal of higher frequency $x \cdot f_{ref}$.

The invention further provides a signal receiver, comprising:

an antenna for receiving electromagnetic signals, at least one low noise amplifier for amplifying the signals received by the antenna, at least one reference oscillator, as described above or at least one frequency synthesizer also described above, arranged for producing a modified reference signal or a high frequency oscillating signal with a predefined duty cycle, a mixer for mixing the amplified and received signals with the modified reference signal or with the high frequency oscillating signal for generating intermediate signals, a filter for filtering the intermediate signals, the reference oscillator comprising an adjustment circuit suitable for adjusting the duty cycle according to a frequency of the electromagnetic signals received for minimizing an amplitude of at least one higher harmonic component of the modified reference signal and present in the filtered intermediate signals.

Thus, in the receiver according to the invention, the duty cycle of the modified reference signal is predefined according to a frequency of the signals received on the antenna, for minimizing the influence of any possible harmonics present around the frequency of the signals received on the antenna. And the optimum duty cycle is set as soon as the receiver is activated, and no setting up time is necessary at each activation of the receiver for having an optimized reception.

BRIEF DESCRIPTION OF THE FIGURES

The invention will be described below in more detail with the aid of the appended drawings, given by way of non-restrictive examples, in which.

DETAILED DESCRIPTION OF THE INVENTION

As stated earlier, the invention provides a new reference oscillator 20. The invention also provides a frequency synthesizer 70 and a signal receiver comprising a reference oscillator 20.

Figure 3:
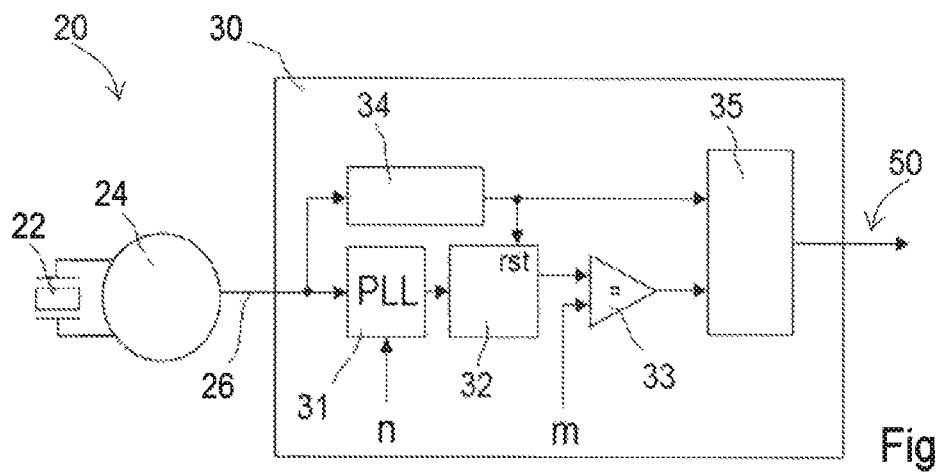
FIG. 3 shows a diagram of a reference oscillator according to the invention producing a modified reference signal with a controlled duty cycle.

FIG. 3 details a reference oscillator 20 according to the invention, e.g. a MEMS or quartz crystal oscillator. It comprises a reference generator 24 locked onto a reference resonator 22. The resonator 22 may be a MEMS resonator, a quartz crystal resonator, or a similar resonator. Examples of implementation of the resonator 22 and the reference generator 24 are also described in patent application EP 2 869 483 A1. The signal generator 24 supplies an initial reference signal 26 of constant and stable reference frequency $f_{ref}$, typically in the range of several MHz, e.g. 26 MHz.

In a reference oscillator 20 according to the invention, as represented in FIG. 3, the generator 24 is connected to an adjustment circuit 30 of the duty cycle. The circuit 30 generates, on the basis of the initial reference signal 26 from the signal generator 24, a modified reference signal 50 having, for example, a rectangular waveform having an alternating sequence of ON times 51 and OFF times 52. The duty cycle r defines the relationship between the duration of the ON times 51 and the duration of the OFF times 52 of the modified reference signal 50.

In the oscillator 20 according to the invention, the adjustment circuit 30 of the duty cycle is arranged for supplying a modified reference signal having a predefined duty cycle r according to at least one adjustment parameter so as to minimize at least one harmonic component of the modified reference signal 50. In the example in FIG. 2, the reference oscillator 20 is used for producing a signal receiver and at least one adjustment parameter is selected according to a frequency of the electromagnetic signals received on the antenna or amplified, as will be seen better later.

For a rectangular signal, the amplitude of a rank harmonic h is proportional to $[\sin(pi \cdot h \cdot r)]/(pi \cdot h \cdot r)$, where pi is Archimedes' constant, r is the duty cycle of the rectangular signal, and h is the rank of the harmonic considered. Setting the duty cycle r thus makes it possible to minimize the amplitude of at least one higher harmonic component of the modified reference signal 50 injected parasitically into the spectrum of the desired RF signal and therefore to minimize the harmonic pollution in the vicinity of the received frequency. As shown by the dashed arrow in FIG. 2, the modified reference signal 50 introduces higher harmonics of the signal 50 on the input 12 via parasitic coupling.

According to one embodiment, the reference oscillator 20 comprises a Man/Machine interface MMI (not represented) for enabling a user to supply the adjustment circuit with at least one adjustment parameter of the duty cycle. According to an actual implementation, the MMI may comprise a selection button enabling the user to select a frequency of the signals to be received, and a memory, storing a table comprising, for each frequency of signals liable to be received, the parameter or parameters necessary for adjusting the duty cycle.

According to the embodiment in FIG. 3, the adjustment circuit 30 comprises a circuit for generating the modified reference signal, a circuit comprising a phase-locked loop or PLL 31, a counter 32, a comparator 33 and a pulse generator 34. The PLL 31 is connected to the reference generator 24, and produces a signal of frequency n times greater than the frequency $f_{ref}$ of the reference signal ($f = n \cdot f_{ref}$). The counter 32 is connected to the PLL and counts the pulses of the signal produced by the PLL. The counter is chosen for being capable of counting beyond the number n. The comparator 33 is connected to an output of the counter 32 and compares a number of pulses counted to a predefined value m. The comparator 33 produces an ON signal if the number of pulses counted is less than the predefined value m or an OFF signal otherwise. Finally, the pulse generator 34 is connected to the reference generator 24. It produces an initializing signal of the same frequency $f_{ref}$ as the initial reference signal, the initializing signal here is a pulse signal, comprising a sequence of pulses, one pulse being produced, for example, at each rising edge of the reference signal 26. The initializing signal is applied to an initializing input of the counter for resetting the counter to zero. The adjustment parameters m, n or m/n are supplied according to the application envisaged, e.g. via the MMI interface.

The modified reference signal obtained at the output of the comparator is a rectangular signal, of frequency $f_{ref}$ and which, over a period T, is equal to ON during a first time $T1=m/f_{ref}$ and equal to OFF otherwise. The duty cycle of the modified reference signal obtained in this embodiment is thus equal to $r=m/n=T1/T$ and is imposed by the parameters m and n. According to the invention, the parameters m and n are predefined as explained above.

According to the embodiment in FIG. 3, the adjustment circuit also comprises a circuit 35 for synchronizing the modified reference signal on one flank of the initial reference signal 26. The synchronization circuit makes it possible to overcome a possible phase drift of the adjustment circuit 30. It thus makes it possible, for example, to use a PLL 31 having rather poor noise characteristics, but with the advantage of being of reduced power and size.

The synchronization circuit 35 is in the example of FIG. 3 an RS flip-flop, a SET input of which is connected to the pulse generator 34 and a RESET input of which is connected at the output of the comparator 33, the synchronized modified reference signal 50 being available on an output of the flip-flop 35 which may be connected to a frequency matching circuit 36 of an RF receiver. Whenever it receives the initializing signal on its SET input, the output of the RS flip-flop changes from OFF to ON. The output signal from the flip-flop is thus synchronized on one flank of the initial reference signal 26.

Figure 4:
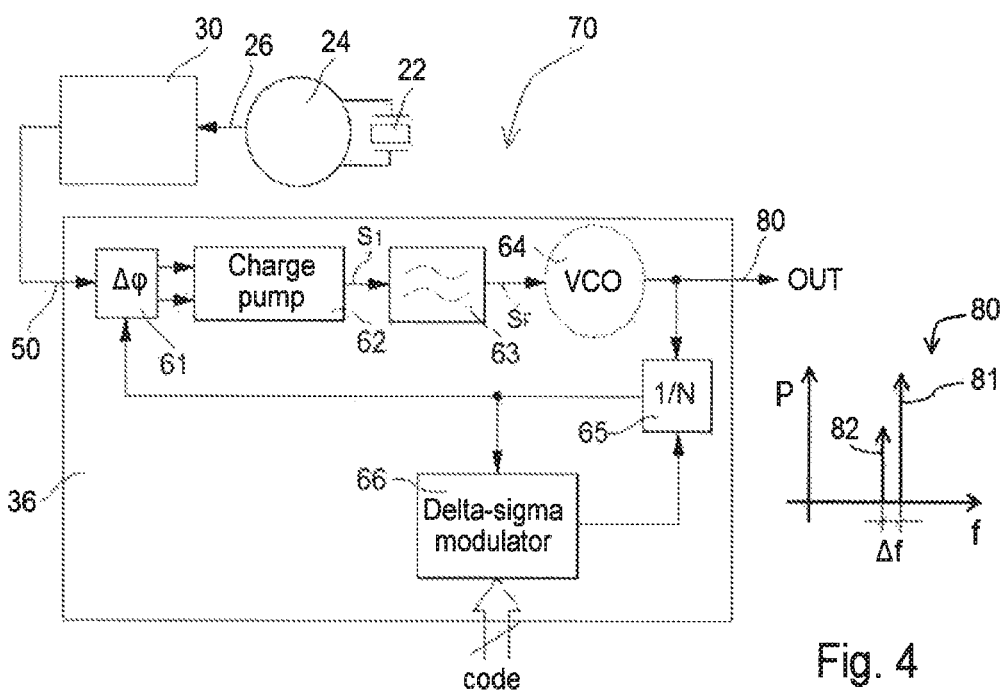
FIG. 4 shows a diagram of a frequency synthesizer according to the invention producing a high frequency signal with a controlled duty cycle.

FIG. 4 details one embodiment of a frequency synthesizer according to the invention comprising a reference oscillator 20 and a frequency matching circuit 36 for producing a high frequency oscillating signal OUT 80. The reference oscillator 20 is, for example, identical to that in FIG. 3. The frequency matching circuit here is a PLL loop 36 comprising a voltage controlled oscillator VCO 64, a divider circuit 65, a phase detector 61, a differential charge pump 62, a low-pass filter 63, and a parameterizing circuit 66.

It should also be noted that the modified reference signal 50 may also be introduced by parasitic coupling of the higher harmonics of the input signal 50 at the input of the VCO 64.

The oscillator 64 supplies the high frequency oscillating signal OUT in a determined frequency band. The divider circuit 65 divides the frequency of the signal OUT by a factor N in order to supply a divided frequency signal $f_{div}$. The circuit 66 adjusts the factor N according to a desired frequency and the divided frequency $f_{div}$. The phase detector 61 compares the modified reference signal 50 at a reference frequency $f_{ref}$ with the divided frequency signal supplied by the divider circuit. The phase detector 61 supplies two control signals UP, DOWN according to the result of the comparison to the differential charge pump 62. The charge pump 62 injects or withdraws the charges in the filter 63 according to the UP or DOWN signals. The low-pass filter 63 filters the output signal $S_1$ of the charge pump for supplying a filtered control signal $S_F$ to the voltage-controlled oscillator 64.

The spectrum of the high frequency oscillating signal 80 shows the frequency signal supplied by the oscillator 64, a signal comprising a main component $f_{out}$ 81 and a harmonic pollution $f_p$ 82 generated by a harmonic of the initial reference signal 26. When the main component 81 and harmonic pollution 82 are too close to each other, the oscillator 64 produces a series of additional harmonics of frequency $f_{out} \pm k \cdot (f_{out} - f_p)$, a phenomenon known as "VCO pulling." The adjustment circuit 30 advantageously makes it possible here to limit the harmonic 82 of the initial reference signal 26, and thus limit the phenomenon of "VCO pulling".

Figure 1:
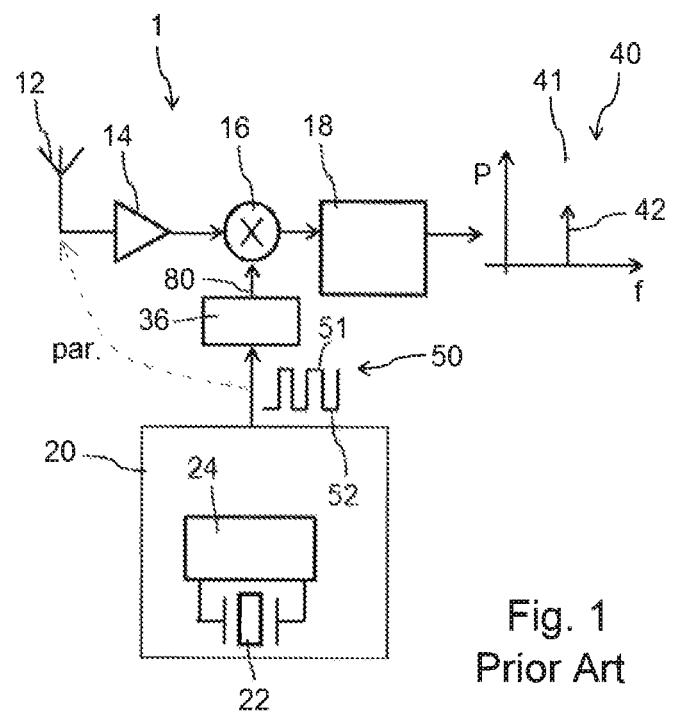
FIG. 1 shows a diagram of a signal receiver according to the prior art.
Figure 2:
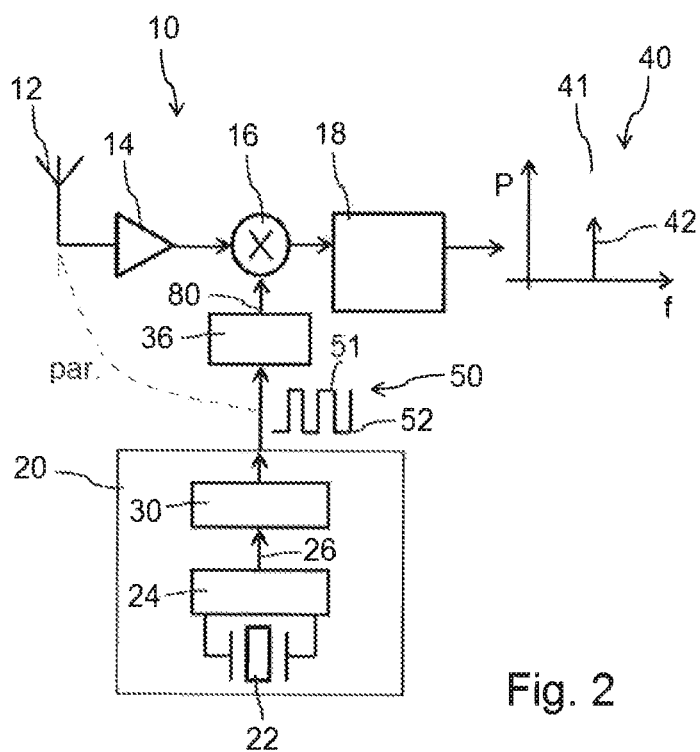
FIG. 2 shows a diagram of a receiver according to the invention.

Finally, FIG. 2 details a signal receiver 10 according to the invention. The receiver comprises an antenna 12, a low noise amplifier LNA 14, a mixer 16 and a band-pass or low-pass filter 18. The antenna 12 is suitable for receiving electromagnetic signals. According to the invention, the receiver also comprises a reference frequency synthesizer comprising a reference oscillator 20 according to the invention and a frequency matching circuit 36. The amplifier 14 is connected to the antenna 12 for amplifying the signals received by the antenna 12. The reference oscillator 20 comprises a reference resonator 22 for generating a modified reference signal 50 alternating ON times and OFF times with a predefined duty cycle. The mixer 16 is connected to the amplifier 14 and to the frequency matching circuit 36 for mixing the amplified and received signals with the high frequency signal OUT 80 and for generating intermediate signals 40. Finally, the band-pass (or low-pass) filter 18 is connected to the output of the mixer for filtering the intermediate signals 40. Implementations of the antenna 12, the amplifier 14, the mixer 16 and the filter 18 are described in detail in patent application EP 2 869 483 A1, incorporated herein by reference. The reference oscillator 20 and the frequency matching circuit 36 may be produced in accordance with FIGS. 3 and 4. It should be noted that the frequency matching circuit 36 is useful here only if the signals received on the antenna have a frequency distant from the frequency of the reference signal. Otherwise, the receiver may be produced without a frequency matching circuit 36.

From the description that has just been given, multiple variations of the reference oscillator, the frequency synthesizer and the signal receiver may be devised by the person skilled in the art without departing from the scope of the invention defined by the claims.

The invention claimed is:

1. A reference oscillator for a transmitter and/or a receiver of electromagnetic signals, the reference oscillator being suitable for generating a modified reference signal alternating ON times and OFF times with a predefined duty cycle from a signal supplied by a reference resonator, wherein the reference oscillator comprising:

an adjustment circuit suitable for adjusting the duty cycle of the modified reference signal according to at least one adjustment parameter so as to minimize at least one higher harmonic component of the modified reference signal, injected parasitically into a spectrum of electromagnetic signals, and a reference generator coupled to the resonator for producing an initial reference signal, the adjustment circuit being coupled to the reference generator for generating the modified reference signal with a predefined duty cycle from the initial reference signal, wherein the adjustment circuit generating the modified reference signal comprises:
- a phase-locked loop or PLL, connected to the reference generator and suitable for producing a signal of frequency n times greater than the frequency $f_{ref}$ of the initial reference signal,
- a counter connected to the PLL loop for counting the pulses of the signal produced by the PLL loop,
- a comparator for comparing a number of pulses counted to a predefined value m, and producing an ON signal if the number of pulses counted is less than the predefined value m or an OFF signal otherwise, and
- a pulse generator connected to the reference generator and arranged for producing an initializing signal of the same frequency as the initial reference signal, said initializing signal being applied to an initializing input of the counter.

2. The reference oscillator according to claim 1, wherein the adjustment circuit also comprises a circuit for synchronizing the modified reference signal on one flank of the initial reference signal.

3. The reference oscillator according to claim 2, wherein the synchronization circuit comprises an RS flip-flop, a SET input of which is connected to the pulse generator and a RESET input of which is connected to the output of the comparator, the synchronized oscillating signal being available at an output of the flip-flop.

4. The reference oscillator according to claim 1, also comprising a Man/Machine interface for enabling a user to supply the adjustment circuit with at least one adjustment parameter of the duty cycle.

5. A frequency synthesizer comprising a reference oscillator according to claim 1 and a frequency matching circuit for producing a high frequency oscillating signal.

6. The frequency synthesizer according to claim 5, wherein the frequency matching circuit comprises a PLL loop arranged for receiving the modified reference signal of frequency $f_{ref}$ and producing an oscillating signal of higher frequency $x \cdot f_{ref}$.

7. The frequency synthesizer according to claim 6, wherein the frequency matching circuit comprises:
- a voltage controlled oscillator VCO for supplying the high frequency oscillating signal OUT,
- a divider circuit for dividing the frequency of the signal OUT by a factor N in order to supply a divided frequency signal $f_{div}$,
- a phase detector for comparing the modified reference signal at a reference frequency $f_{ref}$ with the divided frequency signal $f_{div}$ supplied by the divider circuit and supplying two control signals UP, DOWN according to the result of the comparison,
- a charge pump for receiving the two control signals UP, DOWN of the phase detector, and
- a low-pass filter for filtering an output signal of the charge pump for supplying a filtered control signal to the voltage-controlled oscillator.

8. A signal receiver, comprising:
- an antenna for receiving electromagnetic signals,
- at least one low noise amplifier for amplifying the signals received by the antenna,
- at least one reference oscillator, according to claim 1, for producing a modified reference signal or a high frequency oscillating signal with a predefined duty cycle,
- a mixer for mixing the amplified and received signals with the modified reference signal or with the high frequency oscillating signal for generating intermediate signals, and
- a filter for filtering the intermediate signals,
- an adjustment circuit of the reference oscillator being suitable for adjusting the duty cycle according to a frequency of the electromagnetic signals received for minimizing the amplitude of at least one harmonic component of the modified reference signal and present in the filtered intermediate signals.

* * * * *